June 7, 1966 H. MORGAN 3,255,400
SELF-BIASED FREQUENCY MULTIPLIER BRIDGE UTILIZING VOLTAGE VARIABLE CAPACITOR DEVICES
Filed Dec. 29, 1961 2 Sheets-Sheet 1

HARRY MORGAN
*INVENTOR.*
BY Victor R Beckman
ATTORNEY

HARRY MORGAN
*INVENTOR.*
*BY* Victor R Beckman
ATTORNEY

United States Patent Office 3,255,400
Patented June 7, 1966

3,255,400

SELF-BIASED FREQUENCY MULTIPLIER BRIDGE UTILIZING VOLTAGE VARIABLE CAPACITOR DEVICES

Harry Morgan, Palo Alto, Calif., assignor to Philco Corporation, Philadelphia, Pa., a corporation of Delaware Filed Dec. 29, 1961, Ser. No. 163,158
6 Claims. (Cl. 321—69)

This invention relates to a harmonic generator and more particularly to a frequency doubler utilizing a pair of voltage sensitive capacitor diodes in a balanced circuit arrangement.

In the generation of microwave frequency energy with semiconductor devices, such as transistors, the maximum frequency of oscillation is generally limited to the low microwave frequencies. At microwave frequencies the power output from transistor oscillators is generally small and decreases as the frequency increases. Further, stabilization of transistor oscillators at high frequencies is difficult and often unsatisfactory.

By use of harmonic generators, such as the frequency doubler of this invention, the output from a relatively low frequency oscillator having good frequency and power stability may be multiplied to obtain the desired high frequency output. An arrangement for the generation of microwave energy which includes a harmonic generator may comprise, for example, an oscillator having an output connected to an amplifier. The amplifier output may be fed through one or more frequency multipliers for increasing the output frequency to the desired value. Frequency and power stability of such an arrangement is dependent upon the stability of each of the elements of the chain. A crystal controlled oscillator may be employed for example, having excellent stability, and the amplifier may be compensated by conventional means, to assure maximum stability over wide operating conditions. The frequency multiplier of this invention is made up of a plurality of passive elements, including a pair of nonlinear reactance elements, such as variable capacitance semiconductor diodes (varactors). Since the multiplier is a passive device, the power stability of the chain is virtually unaffected thereby. Thus, when the frequency multiplier of this invention is used with conventional oscillators and amplifiers of good stability, frequency stability of the chain exceeding that of klystrons, traveling wave tubes, and other microwave sources is obtained. The multiplier may be employed in power sources used for a variety of applications where frequency stability, power stability, and reliability are important. Such applications include transmitters, pump signal sources for parametric amplifiers, receiver local oscillators, and the like.

An object of this invention is the provision of a frequency multiplier circuit employing varactor diodes, which circuit makes maximum use of the nonlinear capacitance variations of the diodes.

An object of this invention is the provision of a frequency doubler particularly suited for use in the generation of microwave frequencies, which doubler functions at high efficiency.

An object of this invention is the provision of a frequency doubler employing a pair of variable capacitance semiconductor diodes in a balanced tuned circuit arrangement having increased efficiency and power handling capacity while reducing spurious outputs.

The frequency doubler of this invention comprises a pair of interconnected reactance elements, such as inductors, across which a pair of variable capacitance junction diodes is connected. A fundamental frequency voltage is impressed across the said diodes and, due to variations in the capacitance of the diodes with the magnitude of the voltage impressed thereon, voltages at twice the frequency of the fundamental frequency are produced across the diodes. The second harmonic frequency voltages produced across the variable capacitance diodes are in phase with respect to the junction between the diodes and are supplied to any desired load. Due to the balanced circuit arrangement, the output circuit of the frequency doubler is effectively isolated from the fundamental frequency energy in the input circuit.

In the drawings, wherein like reference characters refer to the same parts in the several views.

Figure 1:
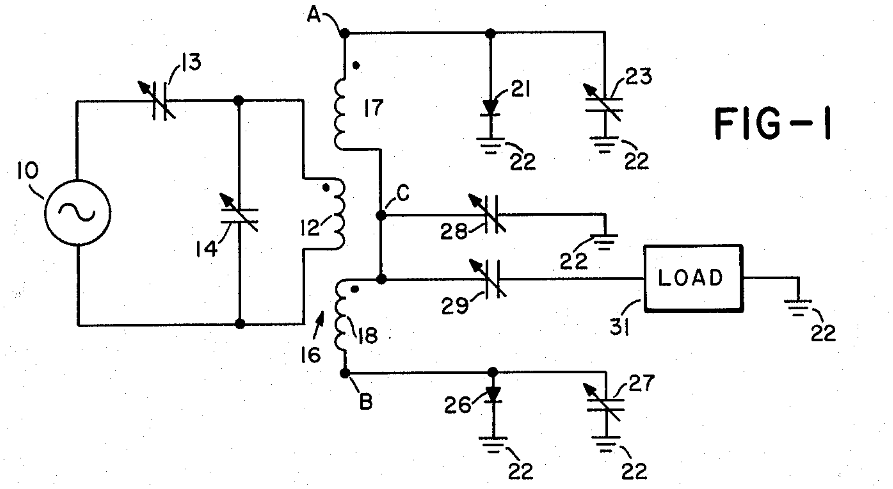
FIGURE 1 is a schematic circuit diagram of a power source employing a frequency doubler embodying this invention.

Reference is first made to FIGURE 1 of the drawings wherein there is shown a microwave power source comprising an oscillator 10 which is preferably of the crystal controlled type for good frequency stability at a fundamental frequency. The oscillator is also designed for a stable power output. The oscillator output is preferably amplified by an amplifier, not shown, having stability over wide operating conditions. The amplified oscillator output is supplied to an inductor 12, included in the novel frequency doubler of this invention, through a matching network comprising a series connected capacitor 13 and shunt connected capacitor 14. The capacitors 13 and 14 tune the inductor 12 to the fundamental driving frequency and also match the doubler to the signal source.

The inductor 12 of the frequency doubler comprises the primary winding of a transformer, designated 16, which transformer includes also a pair of secondary windings, or inductors, 17 and 18. Ends of each of the inductors are connected together at a terminal designated C. The other end of the inductor 17, designated A, is connected through a first voltage variable reactance element 21 comprising a variable capacitance semiconductor diode to a ground connection 22. A trimmer capacitor 23 is connected in shunt with the said voltage variable capacitor 21. Similarly, the other end of the inductor 18, designated B, is connected through a shunt connected variable capacitance semiconductor diode 26 and trimmer capacitor 27 to the ground terminal 22. In addition, the frequency doubler includes a capacitor 28 between the terminal C and the ground connection 22. The output, which is at twice the frequency of the fundamental, is obtained from point C through a capacitor 29, which is shown connected to a load 31 which may be of any type. It will be noted that the interconnected reactive elements, or inductors 17 and 18, and the voltage variable reactance elements 21 and 26, which are interconnected by their common connection to ground 22, comprise a bridge which is energized at the fundamental frequency.

As mentioned above, the inductor 12 and capacitor 14 resonate at the fundamental input frequency. Correct impedance matching between the source 10, and the tuned circuit comprising inductor 12 and capacitor 14, is obtained by the adjustment of the capacitor 13. In the secondary winding of the transformer 16, the series connected inductors 17 and 18 are resonated at the fundamental frequency by the variable capacitance diodes 21 and 26. While not necessarily required, trimmer capacitors 23 and 27 are generally included for adjustment of the resonant circuit to the fundamental frequency and for equalizing, or balancing, the fundamental voltage at points designated A and B. When properly balanced, there is substantially no fundamental frequency voltage between the point designated C and ground 22.

In the illustrated arrangement the cathodes of the variable capacitance diodes 21 and 26 are connected to ground 22, while the anodes thereof are connected to the ends A and B of the windings 17 and 18. It will be seen then, that when the diodes 21 and 26 are reverse biased (as is required for operation in the variable capacitance mode of operation) the diodes function as capacitors and there is no direct current path from the inductors 17 and 18 to ground connection 22. Upon initial operation of the circuit, when the anodes of the diodes 21 and 26 swing positive with respect to the grounded cathodes, the diodes conduct, thereby placing a negative charge on capacitors 28 and 29 and negatively biasing the diodes. Since there is no discharge path for the negative charge on capacitors 28 and 29, the diodes remain in the biased condition. With this self-biasing arrangement, it will be seen that the bias depends upon the magnitude of the driving signal to the doubler. As mentioned above, the doubler circuit is preferably used with an oscillator amplifier arrangement having a stable output potential.

Since, when the circuit is properly balanced by adjustment of the trimming capacitors 23 and 27 where necessary, substantially no fundamental voltage, measured to ground, is produced at the interconnection C between the inductors 17 and 18, it will be apparent that adjustment of the capacitance of the capacitor 28 has no effect on the fundamental frequency tuning. The fundamental frequency voltage is applied to the variable capacitance semiconductor diodes 21 and 26 in opposite phases as indicated by the polarity markings adjacent the windings 17 and 18. Due to the variation in the capacitance of the diodes 21 and 26 with changes in voltage thereon, voltages at twice the frequency of the fundamental frequency are produced across the diodes.

Inductor 17 in series with the capacitor 28, and the parallel combination of varactor diode 21 and capacitor 23 are tuned to resonate at twice the fundamental frequency. Similarly, inductor 18 in series with the capacitor 28, and the parallel combination of varactor diode 26 and capacitor 27, are also tuned to resonate at twice the fundamental frequency.

The second harmonic voltages, produced across the diodes, have the same phase with reference to ground. Hence, the second harmonic current from the diode 21 through the inductor 17 into the capacitor 28, and the second harmonic current from the diode 26 through the inductor 18 into the capacitor 28 are substantially in phase so that a voltage appears across the capacitor 28 at twice the fundamental frequency. The second harmonic energy is supplied through the coupling and impedance matching capacitor 29 to the load 31.

Figure 2:
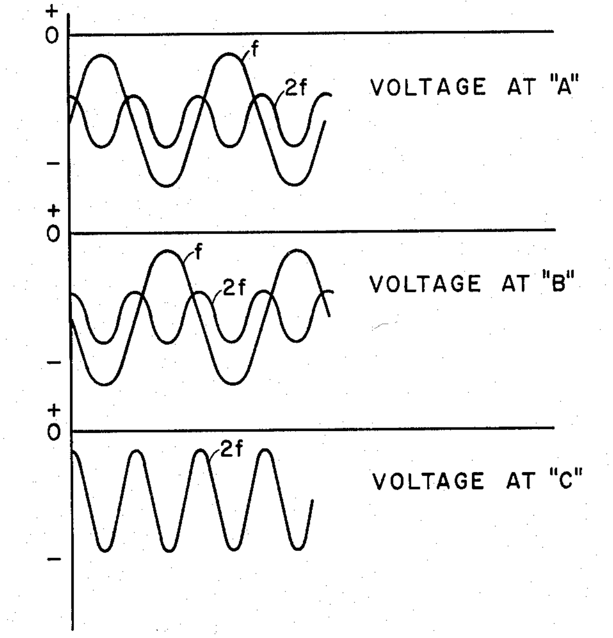
FIGURE 2 illustrates waveforms at various points in the circuits of FIGURES 1 and 4.

The above described operation of the novel frequency doubler of this invention may be better understood upon an examination of the voltage waveforms at points A, B and C with respect to ground shown in FIGURE 2. Referring to FIGURE 2, it will be seen that the fundamental frequency voltages (designated $f$) at points A and B are 180 degrees out of phase. As a result no fundamental frequency component appears at point C with respect to ground. The second harmonic frequency voltages (designated $2f$) at points A and B are in phase, and hence add at point C to provide a second harmonic voltage thereat. It will be noted that the alternating current components operate at a negative bias level as a result of the self-biasing action of the diodes in a manner described above. Due to the balanced circuit arrangement and the resulting cancellation effects, there is no loss of fundamental frequency energy into the load circuit.

Figure 3:
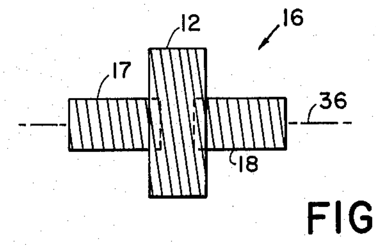
FIGURE 3 is a plan view of an arrangement of inductors used in the circuit of FIGURE 1.

While the inductors 17 and 18 may comprise a single center-tapped secondary winding on the transformer 16, it is preferred to physically separate the same. In one form of coil arrangement illustrated in FIGURE 3, all the coils are wound on a common axis, designated 36, and the fundamental frequency coupling coil 12 is of a larger diameter than the coils 17 and 18. The coils 17 and 18 are spaced apart and the coil 12 is located midway therebetween in the region of minimum second harmonic magnetic field. Loss of second harmonic energy into the input is reduced to an insignificant value with this arrangement. The magnetic fields of inductors 17 and 18 at the fundamental frequency are additive and coupling from inductor 12 to inductors 17 and 18 at the fundamental frequency takes place with negligible loss. Since there is no loss of fundamental frequency energy into the load circuit, and since loss of second harmonic energy into the input circuit is insignificantly small, the novel doubler circuit operates extremely efficiently.

Figure 4:
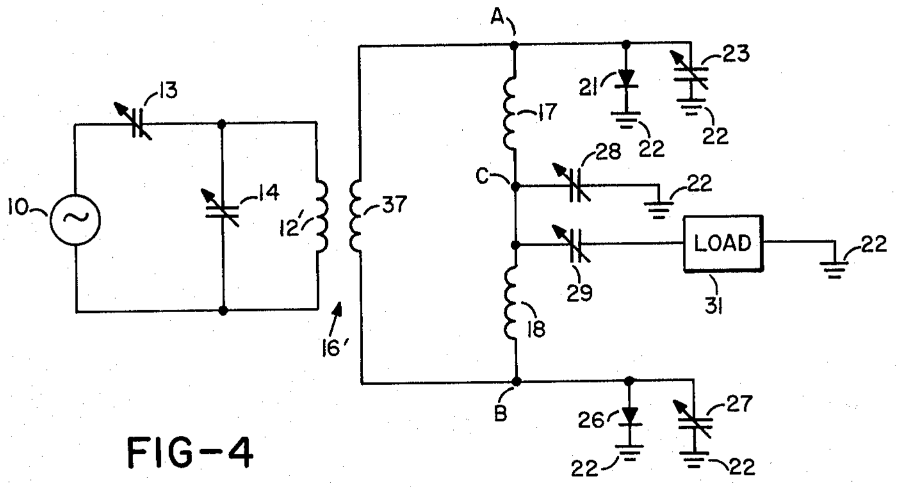
FIGURE 4 is a schematic circuit diagram of a power source employing a modified frequency doubler embodying this invention.

At high frmequencies (e.g. in the UHF range) and particularly where the inductors 17 and 18 are of a stripline construction, magnetic coupling thereto is generally difficult and inconvenient. In order to avoid the difficulties encountered in inductively coupling to a stripline, the circuit of FIGURE 1 may be modified as shown in FIGURE 4, to which reference is now made. As in the circuit of FIGURE 1, the modified arrangement of FIGURE 4 includes an oscillator 10 having a fundamental frequency output supplied to an inductor 12′ through the series connected capacitor 13 and shunt connected capacitor 14. The requirement for inductively coupling to the inductors 17 and 18 in the circuit of FIGURE 4 is eliminated by the inclusion of an inductor 37 as the secondary winding of a transformer 16′, which transformer includes the inductor 12′ as the transformer primary winding. The fundamental frequency voltage developed across the transformer secondary winding 37 is supplied across the interconnected inductors 17 and 18 by direct connection therebetween. Unlike the circuit of FIGURE 1, the inductors 17 and 18 do not serve as transformer secondary windings in the modified circuit of FIGURE 4.

The remainder of the circuit includes the voltage variable capacitance semiconductor diodes 21 and 26 which are interconnected by means of the ground 22 which is common thereto. The diodes, together with the interconnected reactive elements, or inductors, 17 and 18 comprise a bridge arrangement. The transformer secondary winding, or inductor 37, shunted by inductors 17 and 18 in series, is resonated at the fundamental frequency by the variable capacitance diodes 21 and 26. The trimmer capacitors 23 and 27 are preferably included in shunt with the diodes 21 and 26 for adjustment of the frequency tuning and for balancing the fundamental voltage at the bridge terminals designated A and B. When properly balanced, there is substantially no fundamental frequency voltage across the bridge output terminals comprising the point designated C and ground 22.

Second harmonic voltages are produced across the variable capacitance diodes 21 and 26 upon application of the fundamental frequency voltage thereto. As in the circuit of FIGURE 1, the inductor 17 in series with the capacitor 28, and the parallel combination of varactor diode 21 and capacitor 23 are tuned to resonate at twice the fundamental frequency. Similarly, the inductor 18 in series with the capacitor 28, and the parallel combination of varactor diode 26 and capacitor 27 are also tuned to resonate at twice the fundamental frequency. The in-phase second harmonic voltages produced across the variable capacitance diodes 21 and 26 are supplied through the coupling and impedance matching capacitor 29 to the load 31.

Since the second harmonic voltages at points A and B with respect to ground, are in phase and of equal magnitude, substantially no second harmonic current flows in the transformer secondary winding 37 and therefore, there is no loss of second harmonic energy into the input circuit. Since there is no fundamental frequency voltage across the bridge output terminals i.e. between point C and ground 22, there is no loss of fundamental frequency energy into the load circuit. For these reasons, the circuit of FIGURE 4 operates at high efficiencies.

The voltage waveforms at points A, B and C with respect to ground which are shown in FIGURE 2 apply also to the circuit of FIGURE 4. The voltage variable capacitance diodes 21 and 26 are biased at a negative potential by reason of the self-biasing action of the circuit, there being no direct current discharge path to ground for the charge which develops when the diode anodes swing positive with respect to the cathodes.

Figure 5:
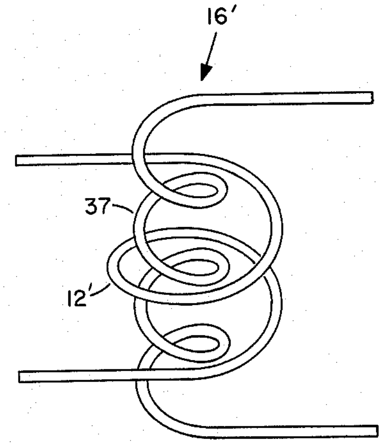
FIGURE 5 is an enlarged plan view of a transformer employed in connecting a source of fundamental frequency energy to the modified frequency doubler shown in FIGURE 4.

Since substantially no second harmonic frequency current flows in the inductor 37, no particular positioning of the inductor 37 relative to the inductor 12 is required to minimize the transfer of second harmonic frequency energy to the input circuit. A tight coupling between the windings is desired to minimize the loss of fundamental frequency energy from the winding 12 to the winding 37. In one suitable coil arrangement, as shown in FIGURE 5, the secondary winding 37 is located within the primary winding 12', with the windings extending along a common axis. Other coil arrangements may obviously be employed.

The invention having been described in detail in accordance with the requirements of the patent statutes, various changes and modifications will suggest themselves to those skilled in this art. For example, the diodes 21 and 26 may be poled in the opposite sense, if desired. Further, although the circuits of FIGURES 1 and 4 are self-biasing, an external bias supply may be connected to the diodes for biasing the same. For example, a source of biasing potential could be connected through a suitable high resistance resistor or choke to the point designated C if desired. Ordinarily, the biasing potential source would substantially equal the self-biasing level of D.-C. potential on the diodes for suitable operation of the frequency multipliers. For this reason, an external bias supply for the diode is ordinarily unnecessary for proper operation. It is intended that the above and other such changes and modifications shall fall within the spirit and scope of the invention as recited in the following claims.

I claim:

1. In combination: a bridge circuit including at least four arms, an adjacent pair of said arms each including an inductive reactance, the other two of said arms each including voltage variable capacitance means; means for impressing a signal of a given frequency across the two junctions of said bridge where the arms including the inductive reactance join the arms including the voltage variable capacitance means; a load interconnected between the other two junctions of said bridge, and means for (1) reverse biasing said voltage variable capacitance means in response to said signal, (2) preventing the flow of direct current between said other two junctions of said bridge, except via said inductive reactances, and (3) preventing the flow of direct current through said load impedance.

2. A frequency doubler, comprising in combination:
  a bridge circuit comprising first and second reactive elements connected together to form a first junction, first and second voltage variable capacitance diodes having like terminals connected together to form a second junction, the other terminals of said diodes being connected respectively to the other terminals of said reactive elements to form third and fourth junctions,
  first means energizing said bridge at a fundamental frequency such that the fundamental frequency voltages at said third and fourth junctions measured with respect to said second junction are 180 degrees out of phase, and
  second means connected between said first and second junctions for reverse biasing said diodes in response to said energization of said bridge and for preventing direct current flow between said first and second junctions, except via said reactive elements.

3. The combination of claim 2 wherein said second means comprises a load impedance and a first capacitor connected in series across said first and second junctions, and a second capacitor connected in shunt with said first capacitor and said load impedance and across said first and second junctions.

4. The combination of claim 2 further including a pair of trimmer capacitors connected in shunt with said diodes, respectively.

5. A frequency multiplier, comprising, in combination:
  a transformer having a primary winding and a pair of secondary windings, one terminal of each of said secondary windings being connected together to form a first junction,
  a pair of voltage variable capacitance diodes having like terminals connected together to form a second junction, the other terminals of said diodes connected to the other terminals of said secondary windings, respectively, to form third and fourth junctions, and
  a capacitor connected between said first and second junctions such that said capacitor will become charged to reverse bias said diodes in response to the application of a signal of a fundamental frequency to said primary winding, whereby said reverse biased diodes will parametrically generate harmonics of said fundamental frequency.

6. A frequency doubler, comprising, in combination:
  a bridge comprising a pair of inductors interconnected to form a first junction, a pair of voltage variable capacitance semiconductor diodes having like terminals interconnected to form a second junction, the other terminals of said diodes being connected to the other terminals of said inductors, respectively, to form third and fourth junctions,
  means energizing said bridge at a fundamental frequency in a manner such that the fundamental frequency voltages at said third and fourth junctions measured with respect to said second junction are 180 degrees out of phase,
  a first capacitor interconnecting said first and second junctions, each of said inductors being resonated at twice the fundamental frequency by said first capacitor and one of said diodes, and
  a second capacitor and a load impedance connected in series across said first and second junctions,
  said first and second capacitors being connected to charge to reverse bias said diodes in response to the energization of said bridge and to prevent the flow of direct current through said load and between said first and second junctions, except via said inductances.

References Cited by the Examiner

UNITED STATES PATENTS

| | | | |
|---|---|---|---|
| 1,885,728 | 11/1932 | Keith | 321—69 |
| 2,944,205 | 7/1960 | Keizer et al. | 321—69 |
| 2,969,497 | 1/1961 | Zen-Iti Kiyasu et al. | 321—69 |
| 3,023,378 | 2/1962 | Fuller | 88.5 |
| 3,060,364 | 10/1962 | Holcomb | 321—69 |

LLOYD McCOLLUM, *Primary Examiner.*

M. O. HIRSHFIELD, *Examiner.*

G. J. BUDOCK, G. GOLDBERG, *Assistant Examiners.*